United States Patent
Isomura (10) Patent No.: US 7,026,972 B2
(45) Date of Patent: Apr. 11, 2006

(54) A/D CONVERTER

(75) Inventor: Hirofumi Isomura, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/059,371

(22) Filed: Feb. 17, 2005

(65) Prior Publication Data

US 2005/0190096 A1    Sep. 1, 2005

(30) Foreign Application Priority Data

Feb. 27, 2004    (JP)    ............... 2004-053803

(51) Int. Cl.
  *H03M 1/12*    (2006.01)
(52) U.S. Cl. ................... 341/155; 341/162
(58) Field of Classification Search ........... 341/155
    See application file for complete search history.

(56) References Cited

U.S. PATENT DOCUMENTS

| | | |
|---|---|---|
| 5,128,624 A | 7/1992 | Hoshino et al. |
| 5,416,444 A | 5/1995 | Yamauchi et al. |
| 5,477,196 A | 12/1995 | Yamauchi et al. |
| 5,517,155 A | 5/1996 | Yamauchi et al. |
| 6,362,767 B1 * | 3/2002 | Yang et al. .............. 341/155 |
| 6,518,900 B1 * | 2/2003 | Oehler et al. ............ 341/155 |

FOREIGN PATENT DOCUMENTS

JP    A-H10-4353    1/1998

* cited by examiner

*Primary Examiner*—John B. Nguyen
*Assistant Examiner*—Lam T. Mai
(74) *Attorney, Agent, or Firm*—Posz Law Group, PLC (57) ABSTRACT

A voltage-to-time conversion circuit compares a ramp-wave voltage, which steps up at a certain gradient, with each of a reference voltage, an input voltage, and a reference voltage, and produces a PB pulsating signal representing the times which the voltages require for having a predetermined relationship to the ramp-wave voltage. An encoder circuit converts the times into coded data items according to the ratios of the times to a common unit time. A normalization circuit determines a conversion characteristic curve on the basis of the coded data items, into which the times required by the reference voltages are converted, and A/D-converted values predefined for the reference voltages, and fits the coded data, into which the time required by the input voltage is converted, to the characteristic curve. Thus, the A/D-converted value of the input voltage Vin is calculated.

8 Claims, 10 Drawing Sheets

FIG. 13

A/D CONVERTER

CROSS REFERENCE TO RELATED APPLICATION

This application is based upon, claims the benefit of priority of, and incorporates by reference the contents of Japanese Patent Application No. 2004-53803 filed on Feb. 27, 2004.

FIELD OF THE INVENTION

The present invention relates to an A/D converter that performs analog-to-digital (A/D) conversion by comparing an input voltage with a ramp-wave voltage.

BACKGROUND OF THE INVENTION

A double integral type A/D converter integrates an input voltage over a certain period of time, then integrates a reference voltage on behalf of the input voltage, measures the time required for an output voltage of an integrator to return to an initial voltage, and thus provides an analog-to-digital (A/D)-converted value. An A/D converter described in Patent Document 1 (JP-A-10-4353) converts a voltage to be measured into a digital value on the basis of the ratio of an integration time required for integration of a voltage corresponding to the voltage to be measured to an integration time required for integration of a predefined known voltage. Herein, the voltage corresponding to the voltage to be measured and the predefined known voltage are integrated so that a change in an output of the integrator resulting from the integration of the voltage corresponding to the voltage to be measured will be equal to that resulting from the integration of the predefined known voltage. A means for measuring the integration time includes a delay circuit in which a plurality of concatenated inverter circuits sequentially inverts pulses constituting a pulsating signal and propagates the pulsating signal. The integration time is encoded by regarding as a time resolution a time equivalent to a phase difference between adjoining ones of the pulses in the pulsating signal that are sequentially sent from the plurality of predetermined inverter circuits.

The circuitry of an analog unit included in a double integral type A/D converter is relatively simple. For a recent micromachining process of fabricating semiconductors, it is cost-effective that the analog unit be minimized. Moreover, a problem of a long conversion time underlies related arts. The employment of the A/D converter described in the Patent Document 1 makes it possible to shorten the conversion time, though the measuring means must be modified.

Normally, an A/D converter analog-to-digital (A/D)-converts a signal which a multiplexer selects from among a plurality of analog signals. A conventional double integral type A/D converter starts integrating a voltage at an initial voltage of, for example, 0 V. When conversion is completed normally, an integrated voltage is returned to the initial voltage. However, when an interrupt for A/D conversion of other analog signal assigned high priority occurs during conversion of a certain input signal, since the integrated voltage is different from the initial voltage, initialization must be performed in order to initialize the charge in an integrating capacitor. The initialization requires a considerable time. Consequently, the conversion time cannot be further shortened. On the contrary, when the initialization time is shortened, precision deteriorates.

SUMMARY OF THE INVENTION

An accordance with the above problems, it is an object to provide an A/D converter capable of further shortening conversion time while maintaining high precision.

According to a first aspect, a voltage-to-time conversion circuit compares a ramp-wave voltage, which steps up or down at a certain gradient, with each of a first reference voltage, a second reference voltage, and an input voltage that is an object of conversion.

Consequently, the voltage-to-time conversion circuit produces a time from a reference time instant to the instant the ramp-wave voltage and first reference voltage have a predetermined relationship (for example, the voltages become equal to each other), a time from the reference time instant to the instant the ramp-wave voltage and second reference voltage have the predetermined relationship, and a time from the reference time instant to the instant the ramp-wave voltage and input voltage have the predetermined relationship.

An encoder converts the above three times into coded data items according to the ratios of the times to, for example, a common unit time. An arithmetic and logic circuit fits the coded data, which represents the time required by the input voltage, to a conversion characteristic curve determined with the coded data items, which represent the times required by the first and second reference voltages, and A/D-converted values predefined for the first and second reference voltages (for example, a linear function of coded data to an A/D-converted value). Thus, an A/D-converted value of the input voltage is calculated.

According to the above means described in the first aspect, when analog-to-digital (A/D) conversion of a certain signal is completed or when A/D conversion is under way, when an interrupt for A/D conversion of another signal assigned high priority takes place, a ramp-wave voltage that steps up at a certain gradient is initialized to a voltage lower than whichever of the first reference voltage, second reference voltage, and input voltage that is the lowest voltage. Unlike a conventional double integral type A/D converter, the ramp-wave voltage need not be fully initialized to an initial voltage (for example, 0 V). When the ramp-wave voltage steps down at a certain gradient, the ramp-wave voltage is initialized up to a voltage higher than the highest voltage among the first reference voltage, second reference voltage, and input voltage.

This is because a time instant at which the ramp-wave voltage assumes an initial voltage relates as a reference time instant to a time into which the first reference voltage is converted by the voltage-to-time conversion circuit, a time into which the second reference voltage is converted by the voltage-to-time conversion circuit, and a time into which the input voltage is converted by the voltage-to-time conversion circuit. Namely, these times are times measured from the reference time instant. Consequently, not only when A/D conversion is terminated normally but also when A/D conversion is suspended and new A/D conversion is initiated, precision in conversion will not be degraded but the time required for initialization of the ramp-wave voltage and a conversion time can be shortened.

According to a second aspect, the first and second reference voltages serve as the upper and lower limits of the range of voltages assumed by the input voltage of the voltage-to-time conversion circuit. Consequently, an arithmetic and logic circuit can more highly precisely determine a conversion characteristic curve on the basis of coded data items, which represent the times required by the reference voltages corresponding to the upper and lower limits of the range of voltages assumed by the input voltage, and A/D-converted values of the reference voltages. Consequently, the A/D-converted value of the input voltage can be produced with higher precision.

According to a third aspect, the first reference voltage is set to a voltage lower by a predetermined margin voltage than the range of voltages assumed by the input voltage. A second reference voltage is set to a voltage higher by the predetermined margin voltage than the range of voltages assumed by the input voltage. The margin voltage is determined based on a time required for processing to be performed internally by, for example, the voltage-to-time conversion circuit or an encoder circuit. Consequently, the malfunction of the voltage-time conversion circuit or encoder circuit attributable to the fact that the reference voltage and input voltage are close to each other can be prevented reliably.

According to a fourth aspect, the input voltage applied from outside to the A/D converter is transferred to the voltage-to-time conversion circuit after the range of voltages assumed the input voltage is narrowed by an input conversion circuit. In general, the range of voltages assumed by the extraneous input voltage is often identical to the range of voltages convertible by the voltage-to-time conversion circuit (for example, a range of voltages from 0 V to 5 V). When the input conversion circuit is included, when a margin voltage is, as mentioned above, generated so that the reference voltages will be separated from the input voltage by the margin voltage, the voltage-to-time conversion circuit need not limit the range of voltages assumed by the extraneous input voltage so that it can convert the reference voltages. An A/D-converted value can be produced over all the range of voltages assumed by the extraneous input voltage.

According to a fifth aspect, the input conversion circuit includes an input buffer and a sample-and-hold circuit that are characteristic of a high input impedance and a low output impedance respectively. Even a voltage applied from external equipment whose output impedance is relatively high or a voltage that varies relatively largely can be converted highly precisely.

According to a sixth aspect, the same operation and advantage as those of the first aspect can be provided. Moreover, when three or more reference voltages are employed, an A/D-converted value can be produced more highly precisely than when two reference voltages are employed.

According to a seventh aspect, a difference between an A/D-converted value produced by A/D-converting a correction reference voltage that is regarded as an input voltage and an A/D-converted value estimated for the correction reference voltage is calculated (as an offset error). The difference is used as an offset correction value to correct the input voltage. This means would prove helpful especially when an input buffer, a sample-and-hold circuit, or any other circuit that is likely to cause an offset voltage is additionally included. A plurality of correction reference voltages may be employed. When the offset error depends on the input voltage, the offset correction value may be varied depending on the input voltage.

BRIEF DESCRIPTION OF THE DRAWINGS

The above and other objects, features and advantages of the present invention will become more apparent from the following detailed description made with reference to the accompanying drawings. In the drawings.

DESCRIPTION OF THE PREFERRED EMBODIMENTS (First Embodiment)

Referring to FIG. 1 to FIG. 10, the first embodiment of the will be described below.

Figure 1:
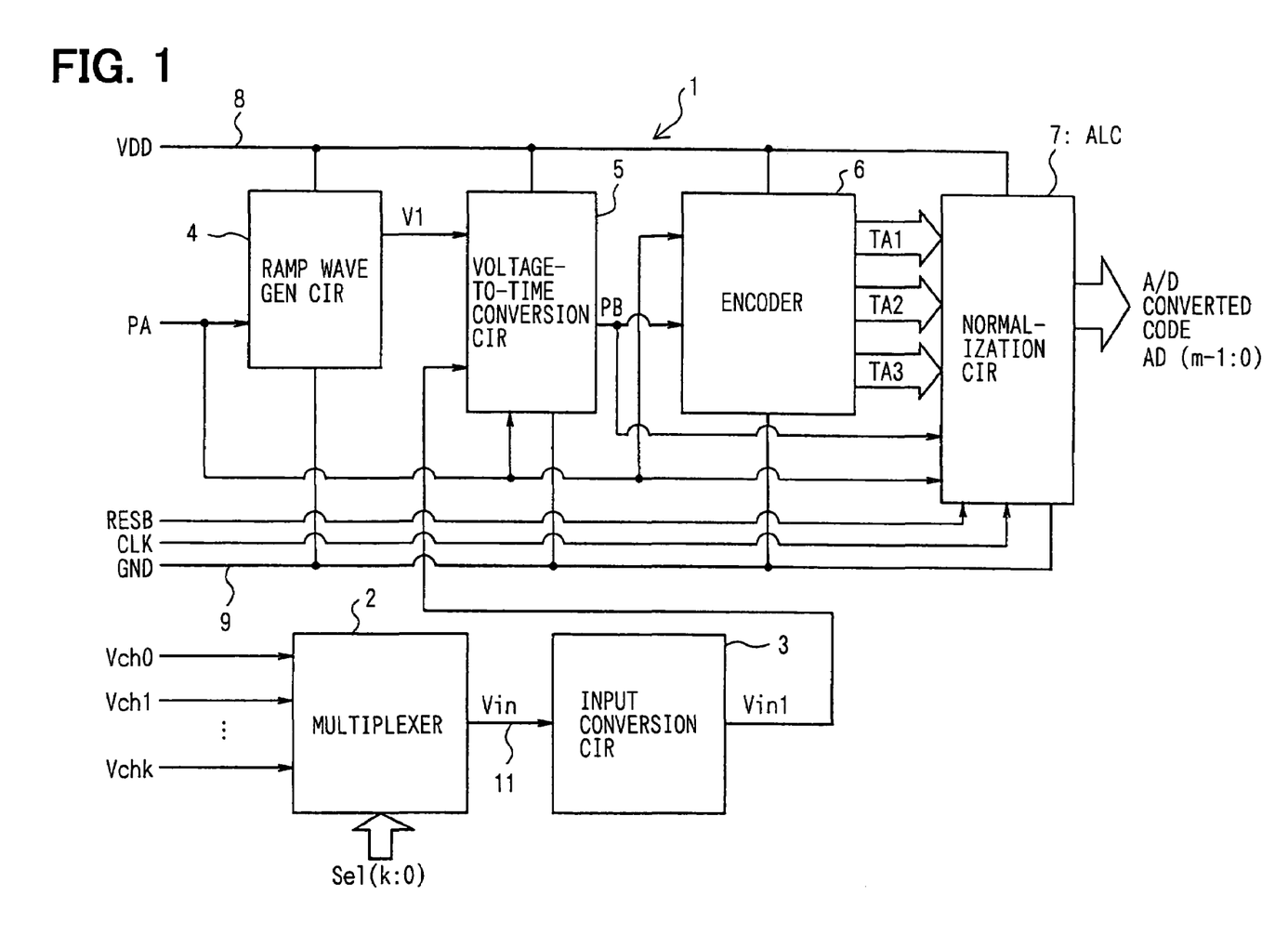
FIG. 1 is a block diagram showing the overall configuration of an A/D converter in accordance with first embodiment.

FIG. 1 is a block diagram showing the overall configuration of an A/D converter whose resolution is m bits. An A/D converter 1 is incorporated in a control IC employed in an electronic control unit (ECU) loaded on, for example, an automobile. The A/D converter 1 analog-to-digital (A/D) converts an input voltage Vin which an analog multiplexer 2 selects from among a plurality of voltages Vch0 to Vchk received from (external) various sensors or the like. The control IC is manufactured through a CMOS process and comprises digital circuits including a CPU and a memory, various analog circuits, and a power circuit.

The A/D converter 1 comprises an input conversion circuit 3, a ramp-wave generation circuit 4, a voltage-to-time conversion circuit 5, an encoder circuit 6, and a normalization circuit 7. These circuits act on receipt of a powers supply voltage VDD (for example, 5V) fed over power lines 8 and 9. The multiplexer 2 and the circuits constituting the A/D converter 1 will be described below.

Figure 2:
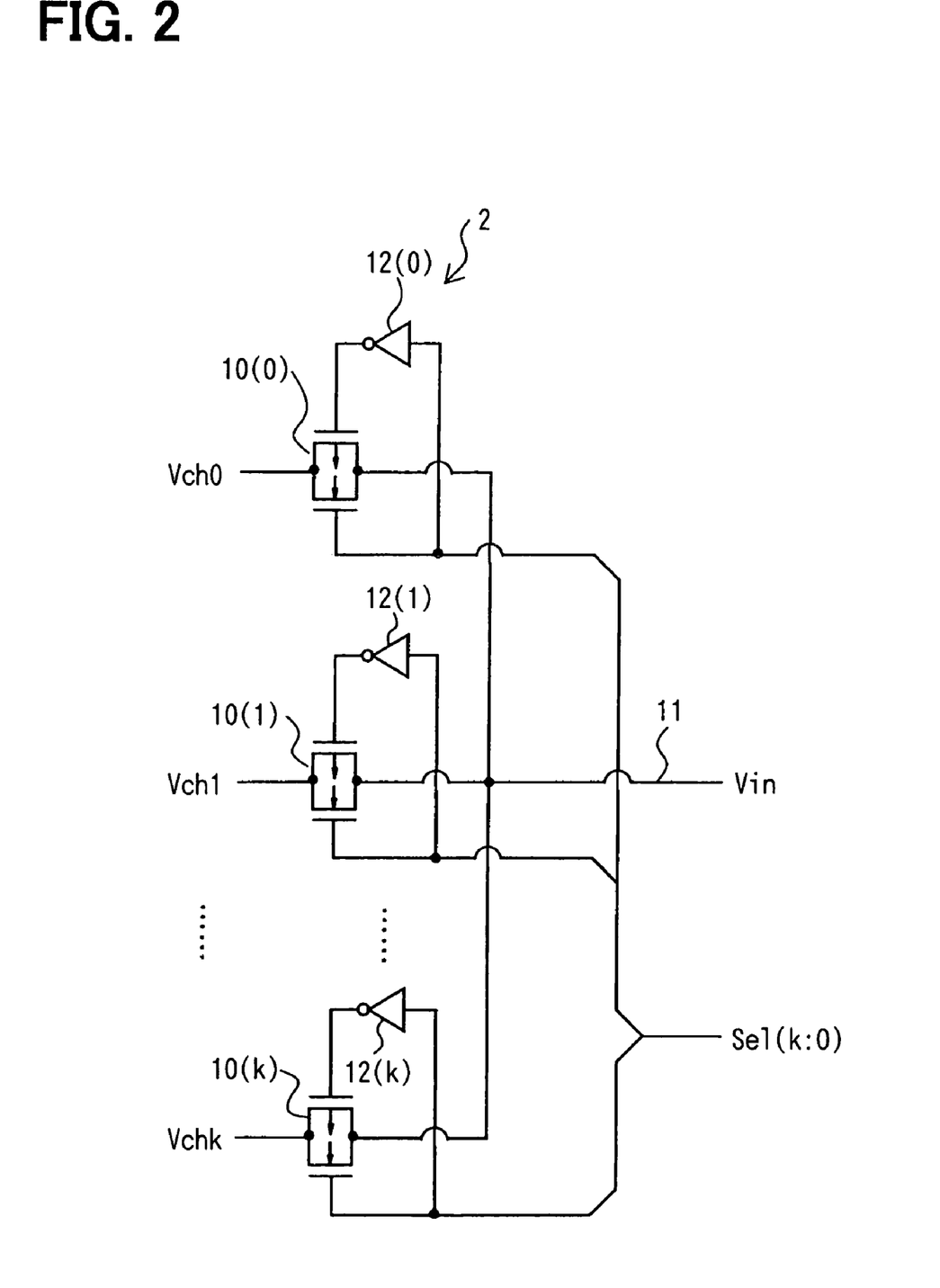
FIG. 2 shows the circuitry of a multiplexer.

FIG. 2 shows the circuitry of the multiplexer 2. Input voltages Vch0, Vch1, etc., and Vchk applied to input lines to which channels are assigned are placed on a common input line 11 via analog switches 10(0), 10(1), etc., and 10(k). The analog switches 10(0), 10(1), etc., and 10(k) associated with the channels are controlled to be turned on or off according to a selection signal Sel(k:0) sent from the CPU or the like and a reverse selection signal which each of inverters 12(0), 12(1), etc., and 12(i) produces by reversing the selection signal sel(k:0).

Figure 3:
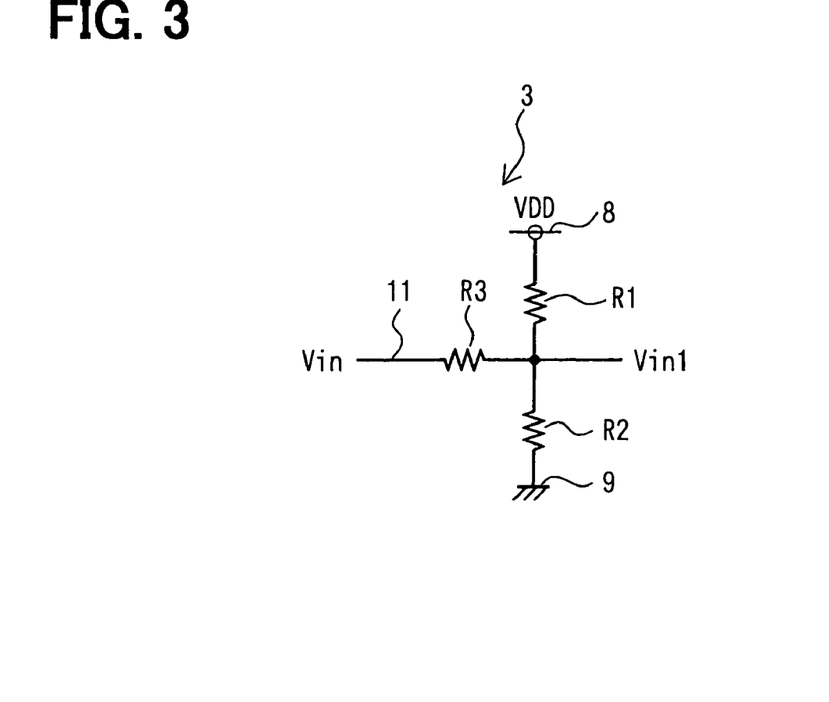
FIG. 3 shows the configuration of an input conversion circuit.

FIG. 3 shows the circuitry of the input conversion circuit 3. Resistors R1 and R2 are connected in series with each other between the power lines 8 and 9. A resistor R3 is connected between a node between the resistors R1 and R2 and the input line 11. A voltage at the node is an input voltage Vin1 to be transferred to the voltage-to-time conversion circuit 5. The resistances of the resistors R1 to R3 have a relationship expressed as follows:

$$R1 = R2 = 2 \cdot R3 \qquad (1)$$

Figure 4:
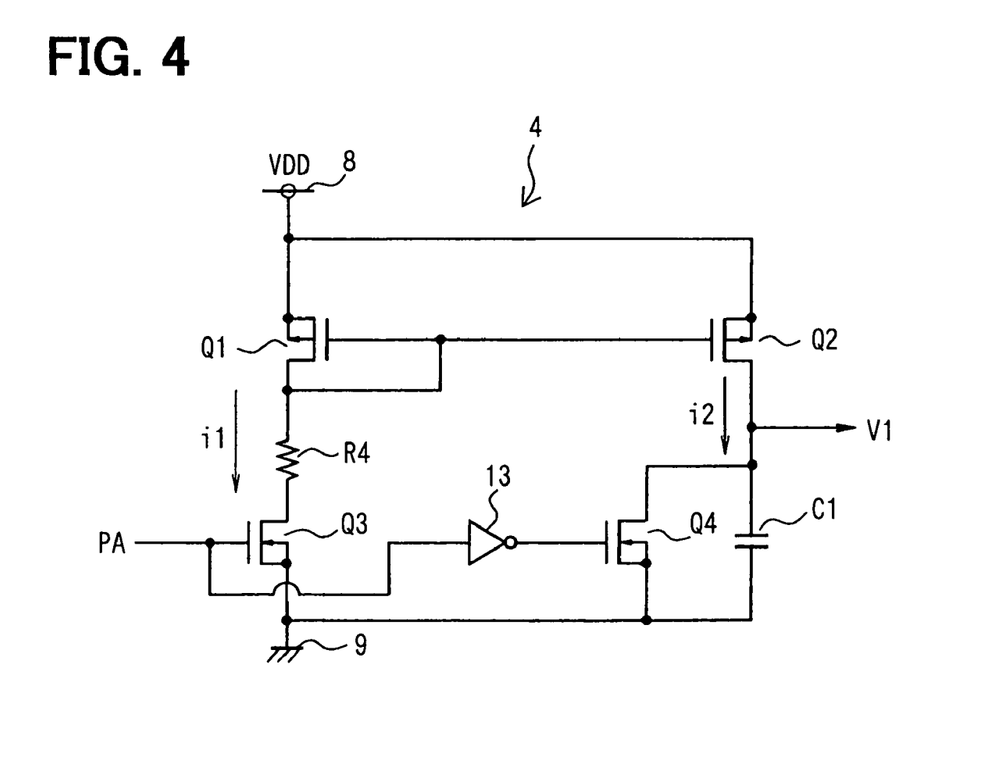
FIG. 4 shows the configuration of a ramp-wave generation circuit.

FIG. 4 shows the circuitry of the ramp-wave generation circuit 4 that generates a ramp-wave voltage V1 which steps up at a certain gradient. A transistor Q1, a resistor R4, a transistor Q3, a transistor Q2, and a capacitor C1 are connected in series with one another between the power lines 8 and 9. The transistors Q1 and Q2 constitute a current mirror. A ramp-wave voltage V1 is developed at the node between the drain of the transistor Q2 and the capacitor C1. A discharge transistor Q4 is connected in parallel with the capacitor C1. A signal PA used to control initiation or termination of A/D conversion is applied to the gate of the transistor Q3. A reverse of the signal PA is applied to the gate of the transistor Q4 via an inverter 13.

Figure 5:
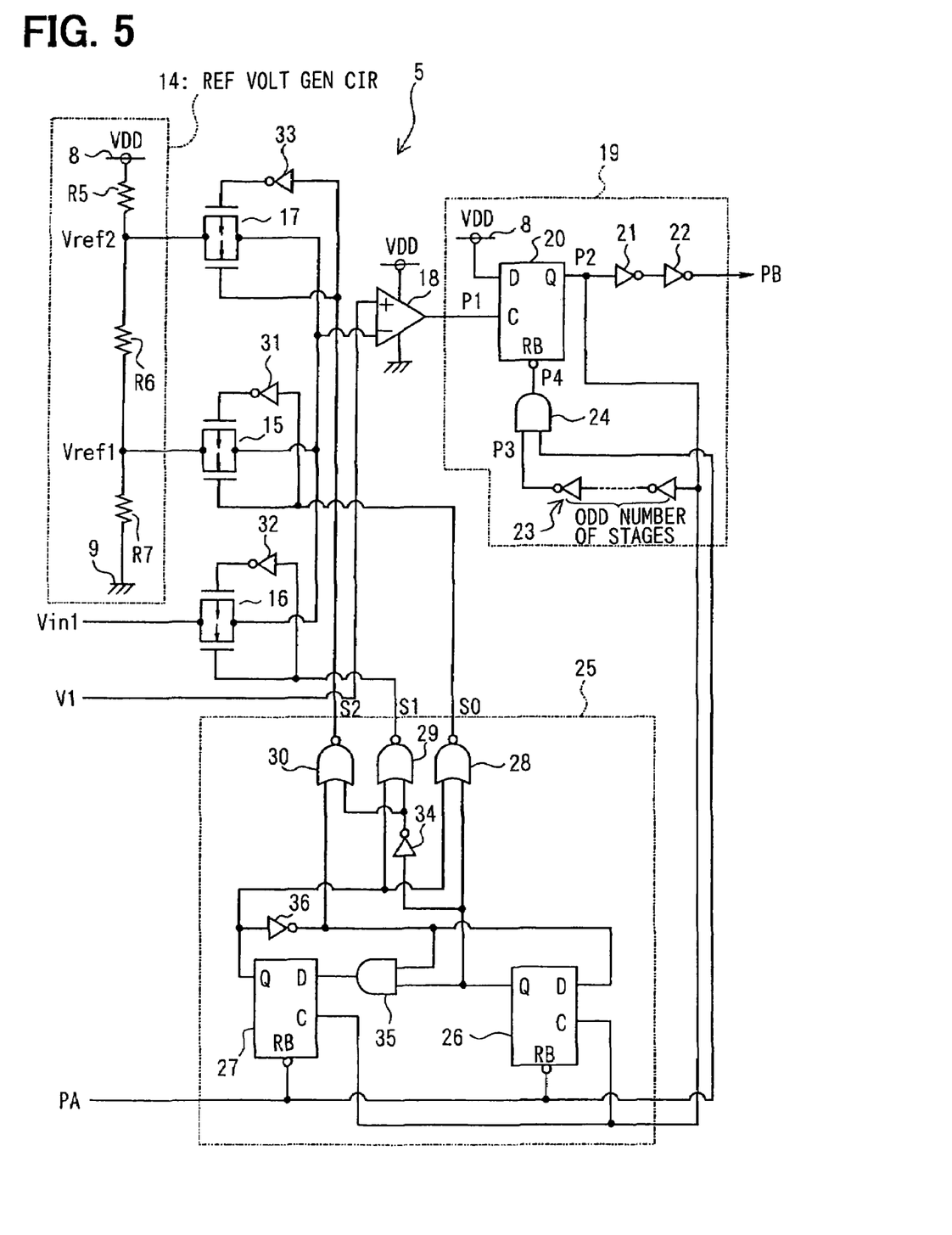
FIG. 5 shows the configuration of a voltage-to-time conversion circuit.

FIG. 5 shows the circuitry of the voltage-to-time conversion circuit 5. The voltage-to-time conversion circuit 5 includes a reference voltage generation circuit 14. In the reference voltage generation circuit 14, resistors R5, R6, and R7 are connected in series with one another between the power lines 8 and 9. Reference voltages Vref2 and Vref1 (equivalent to the first and second reference voltages) are developed at a node between the resistors R5 and R6 and a node between the resistors R6 and R7 respectively. The reference voltage Vref1 is, as described later, set to a voltage lower by a predetermined margin voltage than the range of voltages assumed by an input voltage Vin1. The reference voltage Vref2 is set to a voltage higher by the predetermined margin voltage than the range of voltages assumed by the input voltage Vin1.

The voltage-to-time conversion circuit 5 compares the ramp-wave voltage V1 with each of the reference voltage Vref1, input voltage Vin1, and reference voltage Vref2, and produces a PB pulsating signal indicating times required by the reference voltage Vref1, input voltage Vin1, and reference voltage Vref2 respectively. The reference voltage Vref1, input voltage Vin1, and reference voltage Vref2 are applied to an inverting input terminal of a comparator 18 via voltage selection analog switches 15, 16, and 17. The ramp-wave voltage V1 is applied to the noninverting input terminal of the comparator 18.

A one-shot pulse generation circuit 19 is connected to an output terminal of the comparator 18. The one-shot pulse generation circuit 19 generates a high-level pulse, of which pulse duration is short, when an output signal of the comparator 18 makes a low (0 v)-to-high (voltage VDD) transition. The one-shot pulse contained in the PB pulsating signal shall be called a PB pulse.

The output terminal of the comparator 18 is connected to a clock terminal C of a D flip-flop 20, and the power line 8 is connected to a data terminal D of the D flip-flop 20. Moreover, the PB pulsating signal is transmitted via the output terminal Q by way of inverters 21 and 22. The output terminal Q is connected to an input terminal of an AND gate 24 via a delay circuit 23 having an odd number of inverters connected in series with one another. A signal PA is applied to the other input terminal of the AND gate 24, and the output terminal of the AND gate 24 is connected to a reset terminal RB of the D flip-flop 20.

A selection control circuit 25 extends control so that the analog switches 15, 16, and 17 will be sequentially turned on one by one. The selection control circuit 25 includes two D flip-flops 26 and 27, and transmits selection signals S0, S1, and S2 to the analog switches 15, 16, and 17 respectively via NOR gates 28, 29, and 30 included therein. The selection signals S0, S1, and S2 are applied directly to the analog switches 15, 16, and 17 respectively and also applied to the analog switches 15, 16, and 17 respectively via the inverters 31, 32, and 33 respectively.

A signal PA is applied to reset terminals RB of the D flip-flops 26 and 27, and an output signal of a D flip-flop 20 is applied to clock terminals C of the D flip-flops 26 and 27. The output terminal Q of the D flip-flop 26 is connected directly to an input terminal of the NOR gate 28, and also connected to input terminals of the NOR gates 29 and 30 via an inverter 34. Furthermore, the output terminal Q of the D flip-flop 26 is connected to a data terminal D of the D flip-flop 27 via an AND gate 35. On the other hand, the output terminal of the D flip-flop 27 is connected directly to input terminals of the NOR gates 28 and 29, and also connected to each of an input terminal of the NOR gate 30, an input terminal of the AND gate 35, and a data terminal D of the D flip-flop 26 via an inverter 36.

Figure 6:
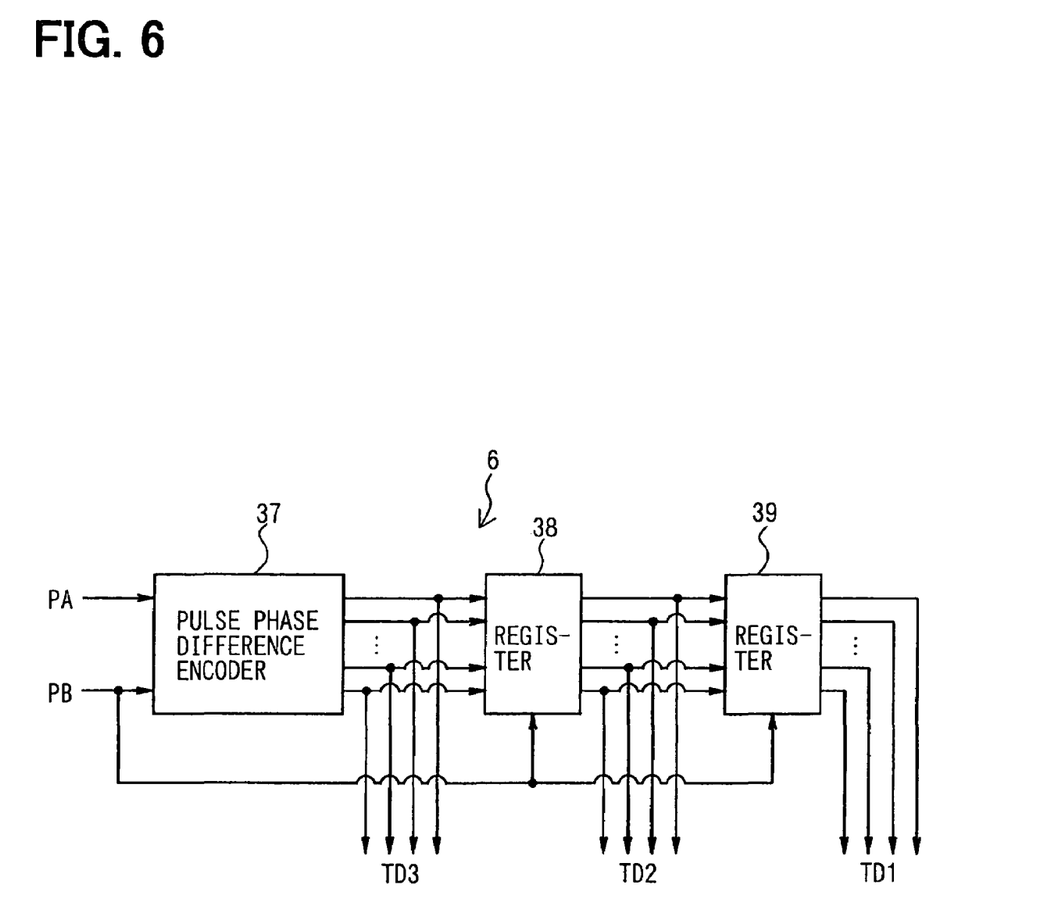
FIG. 6 shows the configuration of an encoder circuit.

FIG. 6 shows the circuitry of the encoder circuit 6. The encoder circuit 6 converts times T1, T2, and T3, which are times from the instant a signal PA goes high to the instant a PB pulse is generated (times required by the reference voltage Vref1, input voltage Vin1, and reference voltage Vref2) (See FIG. 10) into coded data items TA1, TA2, and TA3 according to the ratios of the times to a common unit time (a delay time Td caused by an inverter (not shown)). The encoder circuit 6 has a pulse phase difference encoder 37, a register 38, and a register 39 connected in tandem. Reference numerals TD1 to TD3 denotes output data items of the pulse phase difference encoder 37, register 38, and register 39 respectively.

The pulse phase difference encoder 37 is described in Japanese Unexamined Patent Application Publications Nos. 03-220814, 06-216721, 07-183800, and 07-283722, the contents of all of which are incorporated herein by reference. The pulse phase difference encoder 37 comprises: for example, a delay circuit that develops a delay signal at a predetermined node leading to any of a plurality of concatenated delay elements (inverters); a digital data production circuit that produces digital data representing the position of a delay element, which has produced a delay signal, in response to each input PB pulse; and an arithmetic and logic circuit that calculates binary-coded data, which is proportional to a phase difference between the signal PA and PB pulse, according to the digital data. The coded data which the pulse phase difference encoder 37 produces in response to each PB pulse is transmitted to and held in the registers 38 and 39.

The normalization circuit 7 (equivalent to an arithmetic and logic circuit) shown in FIG. 1 calculates an A/D-converted value of an input voltage Vin1, that is, an input voltage Vin by determining a conversion characteristic curve on the basis of coded data items TA1 and TA3, which represents the times required by the reference voltages Vref1 and Vref2, and A/D-converted values Lf1 and Lf2 predefined for the reference voltages Vref1 and Vref2, and fitting coded data TA2, which represents the time required by the input voltage Vin1, to the characteristic curve. The normalization circuit 7 is a logical circuit (hardware) that receives a clock CLK, a reset signal RESB, and a PB pulsating signal. Alternatively, the normalization circuit 7 may be realized with software to be run by a CPU included in a control IC.

Next, an operation of the present embodiment will be described with reference to FIG. 7 to FIG. 10.

Figure 7:
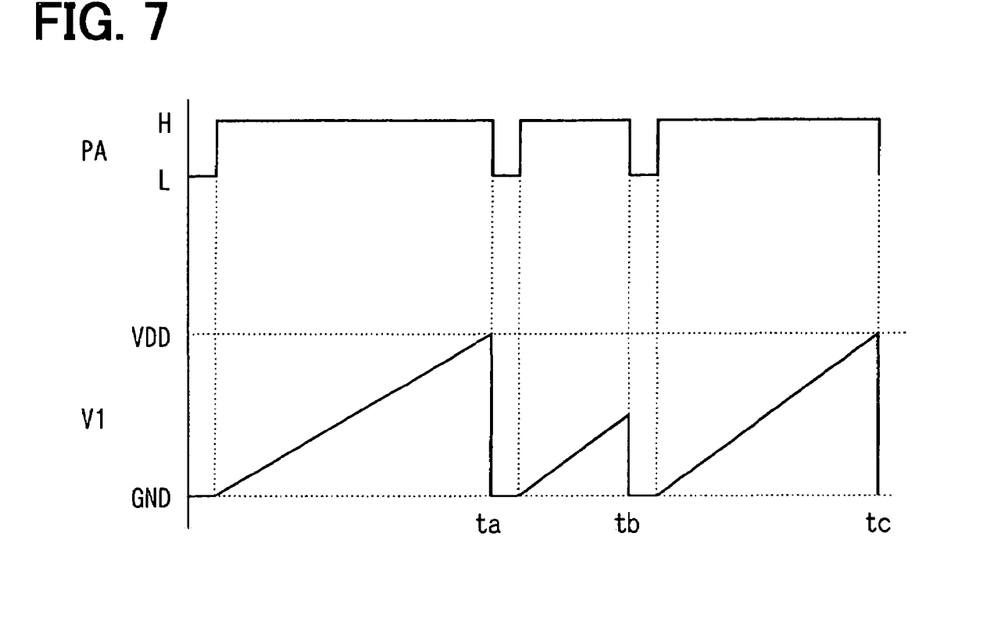
FIG. 7 shows the waveforms of a signal PA and a ramp-wave voltage V1.

FIG. 7 shows the waveforms of a signal PA and a ramp-wave voltage V1. When a selection signal Sel(k:0) is transferred to the multiplexer 2, a channel on which an object of A/D conversion is propagated is selected and the signal PA makes a low (0V)-to-high (VDD) transition. The ramp-wave voltage V1 starts stepping up from an initial voltage (for example, 0 V) at a certain gradient. The A/D converter 1 initiates A/D conversion of an input voltage Vin on the selected channel.

During A/D conversion, the transistor Q3 included in the ramp-wave generation circuit 4 shown in FIG. 4 is set to an on state, and the transistor Q4 included therein is set to an off state. A certain current i2 equal to a current i1 determined from the supply voltage VDD and the resistance of the resistor R4 flows into the capacitor C1. When the initial charge in the capacitor C1 is zero, the ramp-wave voltage V1 is expressed with the following formula (2), wherein t denotes an elapsed time from the instant the signal PA makes a low-to-high transition:

$$V1 = (i2/C1) \times t \qquad (2)$$

When A/D conversion is completed because the ramp-wave voltage V1 reaches the same voltage as the supply voltage VDD (time instant ta or tc in FIG. 7) or when an interrupt signal commanding initiation of A/D conversion of a signal on any other channel is received during A/D conversion (time instant tb), the signal PA makes a high-to-low transition. The A/D converter 1 terminates A/D conversion. In this case, the transistor Q3 in the ramp-wave generation circuit 4 enters an off state and the transistor Q4 in the ramp-wave generation circuit 4 enters an off state. A charge current i2 flowing into the capacitor C1 becomes zero. The capacitor C1 is rapidly discharged via the transistor Q4. Consequently, the ramp-wave voltage V1 becomes 0 V.

As described later, the ramp-wave voltage V1 need not be fully initialized to 0 V. When the ramp-wave voltage V1 is initialized to a voltage lower than at least the reference voltage Vref1, the next A/D conversion can be initiated. Consequently, although FIG. 7 and FIG. 8 show a pause period that comes after the time instant ta or tb, the instant the ramp-wave voltage V1 steps down to a voltage lower than the reference voltage Vref1, the next A/D conversion may be initiated.

Figure 8:
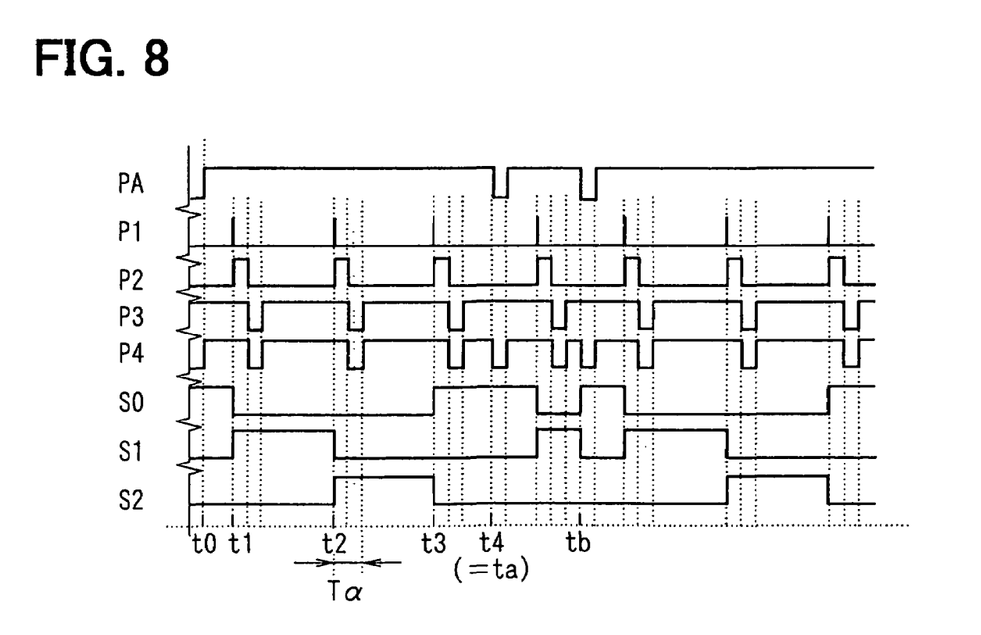
FIG. 8 is a timing chart indicating the timings of signals produced in the voltage-to-time conversion circuit.
Figure 9:
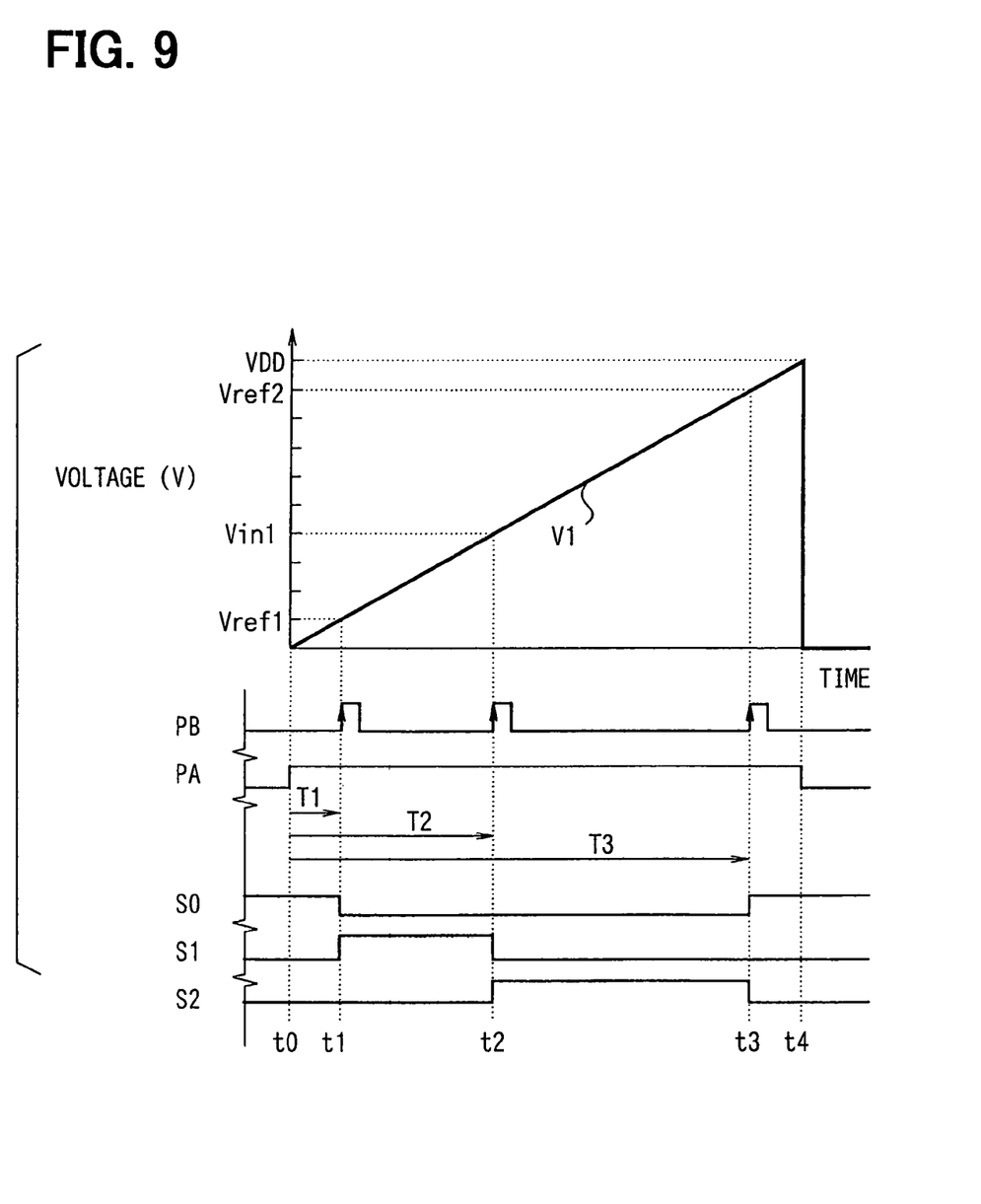
FIG. 9 shows the waveforms of the ramp-wave voltage V1 and the signals produced by components of the voltage-to-time conversion circuit, which are observed during one A/D conversion.

FIG. 8 shows the waveforms of signals produced by components of the voltage-to-time conversion circuit 5. FIG. 8 shows from below a signal PA, an output signal P1 of the comparator 18, an output signal P2 of the D flip-flop 20, an output signal P3 of the delay circuit 23, a reset signal P4 of the D flip-flop 20, and selection signals S0, S1, and S2. Moreover, FIG. 9 shows a ramp-wave voltage V1, a PB pulsating signal, the signal PA, and the selection signals S0, S1, and S2 which are produced during one A/D conversion. The pulse durations of the signals P2, P3, and P4 in FIG. 8 are drawn in a slightly exaggerated manner for providing better understanding. The timings of generating pulses are therefore slightly deviated from those shown in FIG. 9.

Referring to FIG. 8 and FIG. 9, a description will be made of actions to be performed in the voltage-to-time conversion circuit 5 shown in FIG. 5. When the signal PA is low, the D flip-flops 20, 26, and 27 are reset. Among the selection signals S0, S1, and S2, the selection signal S0 alone is high. Consequently, the analog switch 15 is turned on, and the analog switches 16 and 17 are turned off. The comparator 18 compares the ramp-wave voltage V1 with the reference voltage Vref1.

When the signal PA makes a low-to-high transition, the reset states of the D flip-flops 20, 26, and 27 are canceled immediately. When the ramp-wave voltage V1 reaches the same voltage as the reference voltage Vref1 (time instant t1), the output signal P1 of the comparator 18, the output signal P2 of the D flip-flop 20, and the PB pulsating signal go high. In the selection control circuit 25, the signal P2 is used as a clock. The output signal of the D flip-flop 26 goes high and the output signal of the D flip-flop 27 goes low, the selection signals S0 and S2 go low, and the selection signal S1 goes high. At this time, the analog switch 16 is turned on, and the analog switches 15 and 17 are turned off. The comparator 18 compares the ramp-wave voltage V1 with the input voltage Vin1.

On the other hand, in the one-shot pulse generation circuit 19, a reset signal P4 goes low at a time instant that lags behind a time instant t1, at which the signal P2 goes high, by a delay time Tc produced by the delay circuit 23. A PB pulsating signal is returned to a low level. The reset signal P4 goes high the delay time Tc later. The reset state of the D flip-flop 20 is canceled.

Thereafter, when the ramp-wave voltage V1 reaches the same voltage as the input voltage Vin1 (time instant t2), the PB pulsating signal temporarily goes high in the same manner as when the ramp-wave voltage V1 is compared with the reference voltage Vref1. In the selection control circuit 25, the output signals of the D flip-flops 26 and 27 go high, the selection signals S0 and S1 go low, and the selection signal S2 goes high. Consequently, the analog switch 17 is turned on and the analog switches 15 and 16 are turned off. The comparator 18 compares the ramp-wave voltage V1 with the reference voltage Vref2. When the ramp-wave voltage V1 steps up to reach the same voltage as the input voltage Vref2 (time instant t3), the PB pulsating signal exhibits a one-shot pulse. In the selection control circuit 25, the selection signals S1 and S2 go low and the selection signal S0 goes high.

In other words, a time T1, T2, or T3 from the instant (time instant t0) the signal PA makes a low-to-high transition to the instant (time instant t1, t2, or t3) a one-shot PB pulse is generated corresponds to a time required by the reference voltage Vref1, input voltage Vin1, or reference voltage Vref2. In this case, the time instant t0 serves as a reference time instant for all the times T1, T2, and T3 and is a time instant satisfying at least the condition of T1>1. Consequently, an initial voltage at which the ramp-wave voltage V1 starts stepping up need not be 0 V but may be a voltage lower at least than the reference voltage Vref1.

Now, a method of determining the reference voltages Vref1 and Vref2 will be described below. As mentioned above, after the one-shot pulse generation circuit 19 produces a PB pulsating signal having a pulse duration of Tc in response to the output signal P1 (leading edge) of the comparator 18, the one-shot pulse generation circuit 19 requires a reset time Tα (=2·Tc) until it will be able to receive the output signal P1 again. Therefore, a margin voltage must be generated as a voltage, by which the reference voltage Vref1 is separated from the input voltage Vin1 and the input voltage Vin1 is separated from the reference voltage Vref2, in order to ensure the reset time Tα. The margin voltage varies at the gradient of the ramp-wave voltage V1. Assuming that the minimum voltage and maximum voltage of the input voltage Vin1 are Vin1(min) and Vin1(max) respectively, the following formulas (3) and (4) must be satisfied:

$$T\alpha < (Vin1(\min) - Vref1)/(i2/C1) \quad (3)$$

$$T\alpha < (Vref2 - Vin1(\max))/(i2/C1) \quad (4)$$

Since the generation of the margin voltage is needed, when an extraneous input voltage Vin (whose voltage ranges from 0 V to the voltage VDD) is applied as an input voltage Vin1 to the voltage-to-time conversion circuit 5 as it is, the reference voltage Vref1 must be set to a negative voltage and the reference voltage Vref2 must be set to a voltage exceeding 5 V. This is disadvantageous in supplying power to the voltage-to-time conversion circuit 5. Therefore, the input conversion circuit 3 is used to narrow the range of voltages assumed by the input voltage Vin, and transfers the resultant voltage to the voltage-to-time conversion circuit 5. The relationship between the input voltages Vin and Vin1 is expressed as follows:

$$Vin = 2 \times Vin1 - VDD/2 \quad (5)$$

For example, assuming that an A/D conversion time is 5 μs and a supply voltage VDD is 5 V, the current i2 and the capacitance C1 are calculated as 10 μA and 10 pF respectively according to the formula (2). Moreover, when the range of voltages assumed by the input voltage Vin is a range from 0 V to 5 V, the range of voltages assumed by the input voltage Vin1 is calculated to be a range from 1.25 V to 3.75 V according to the formula (5). When the reset time Tα is 300 ns, a change in the ramp-wave voltage V1 occurring during the reset time Tα is calculated as 10 μA/10 pF×300 ns=0.3 V. Consequently, when the reset time Tα alone is taken into consideration, the reference voltage Vref1 should be smaller than (1.25 V−0.3 V) and the reference voltage Vref2 should be larger than (3.75 V+0.3 V).

Moreover, variations occur from process to process. Assuming that the current i2 varies 10%, the electrostatic capacitance of the capacitor C1 varies 15%, and the reset time Tα varies 30%, the change in the ramp-wave voltage V1 occurring during the reset time Tα is calculated as 10 μA×(1+0.1)/10 pF(1−0.15)×300 ns(1+0.3)=0.505 V.

Consequently, when the variations among processes are taken into consideration, the reference voltage Vref1 should be smaller than (1.25 V−0.505 V), and the reference voltage Vref2 should be larger than (3.75 V+0.505 V). According to the present embodiment, the reference voltage Vref1 is set to 0.5 V(=0.1×VDD level), and the reference voltage ref2 is set to 4.5 V (=0.9×VDD level).

Figure 10:
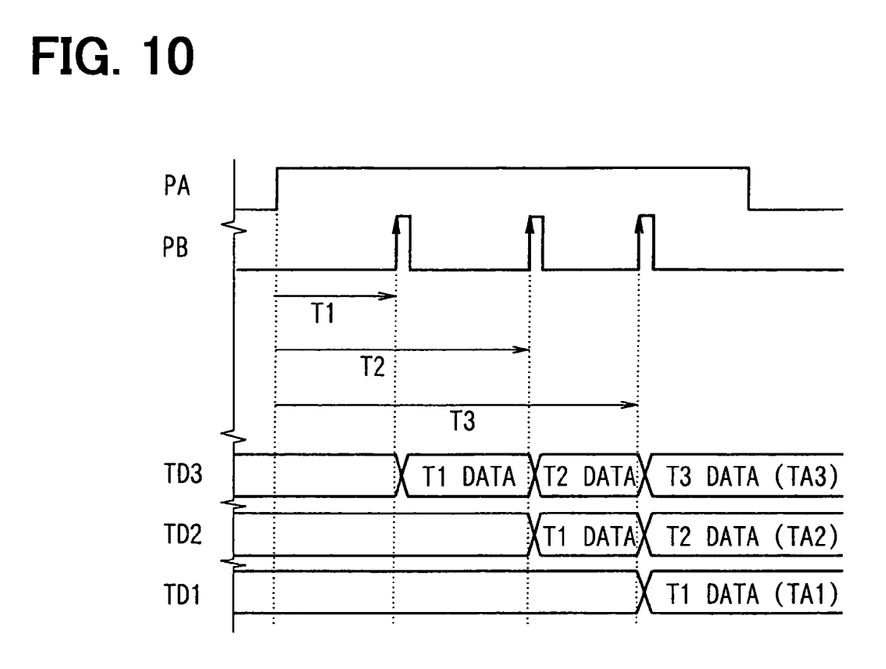
FIG. 10 is a timing chart indicating the timings of signals produced in an encoder circuit.

FIG. 10 is a timing chart concerning the encoder circuit 6. On receipt of a PB pulse, the encoder circuit 6 converts the time T1, T2, or T3, which are times from the instant the signal PA goes high to the instant the PB pulse is generated, into coded data TA1, TA2, or TA3. The coded data items are shifted to the registers 38 and 39 in response to each PB pulse. Finally, the output data TD1 of the register 39 becomes the coded data TA1, the output data TD2 of the register 38 becomes the coded data TA2, and the output data TD3 of the pulse phase difference encoder 37 becomes the coded data TA3. Assuming that the number of bits contained in the input or output of the A/D converter 1 is m, the difference between the maximum value and minimum value assumed by the coded data TA2 that represents the time required by the input voltage Vin1 should be $2^m$ or more.

When the encoder circuit 6 transmits the coded data items TA1, TA2, and TA3, the normalization circuit 7 normalizes the data items according to the number of bits contained in the input or output of the A/D converter and thus calculates an A/D-converted value of the input voltage Vin.

Assuming that a voltage Vin ranging from 0 V to a voltage VDD is received with the supply voltage VDD applied, the lowest-order bit VLSB of an A/D-converted value of m bits long is provided as the formula (6).

$$VLSB = VDD/2^m \quad (6)$$

When the formulas (5) and (6) are used to calculate A/D-converted values (predefined A/D converted values) of the reference voltage Vref1 (=0.1×VDD value) and reference voltage Vref2 (=0.9×VDD value), the A/D-converted values are expressed with the following formulas (7) and (8):

$$Lf1 = (2 \times Vref1 - VDD/2)/VLSB = (-0.3 \times VDD)/VLSB \quad (7)$$

$$Lf2 = (2 \times Vref2 - VDD/2)/VLSB = (1.3 \times VDD)/VLSB \quad (8)$$

When the ramp-wave voltage V1 starts stepping up from 0 V, if a time resolution offered by the pulse phase difference encoder 37 is Td, the coded data items TA1, TA2, and TA3 can be expressed with the following formulas (9), (10), and (11):

$$TA1 = T1/Td = (Vref1/(i2/C1))/Td \quad (9)$$

$$TA2 = T2/Td = (Vin1/(i2/C1))/Td \quad (10)$$

$$TA3 = T3/Td = (Vref2/(i2/C1))/Td \quad (11)$$

The normalization circuit 7 determines a linear function (12), which relates an A/D-converted value Y to coded data X, on the basis of the A/D-converted values Lf1 and Lf2 of the reference voltages Vref1 and Vref2 and the coded data items TA1 and TA3 representing times required by the reference voltages Vref1 and Vref2.

$$Y = a \cdot X + b \quad (12)$$

Herein, a is defined as a formula (13) according to the formulas (7), (8), (9), and (11), and b is defined as a formula (14) according to the formulas (8), (11), and (13).

$$a = (Lf2 - Lf1)/(TA3 - TA1) \quad (13)$$

$$b = Lf2 - 2 \times TA3 \quad (14)$$

Next, Y is calculated as follows:

$$Y = a \cdot TA2 + b \quad (15)$$

For rounding, 0.5 is added to Y provided by the formula (15) in order to work out Z. The decimal places of Z are rounded down. Consequently, when $Z \leq 0$ is true, the A/D-converted value is set to 0. When $Z \geq 2^m - 1$ is true, the A/D-converted value is set to $2^m - 1$. For Z assuming any other value, the Z is adopted as the A/D-converted value as it is. Consequently, an A/D-converted value AD(m-1:0) of an input voltage Vin is obtained. Incidentally, for the purpose of explanation, the formulas are sequentially developed in order to calculate the A/D-converted value. When the normalization circuit 7 is realized with a logical circuit (hardware), arithmetic and logical operations are simplified. For example, since (Lf2−Lf1) included in the formula (13) is a predefined value, it may be stored in a memory in advance.

As described above, the A/D converter 1 in accordance with the present embodiment produces the ramp-wave voltage V1 that steps up at a certain gradient. The ramp-wave voltage V1 is compared with each of the reference voltage Vref1, input voltage Vin1, and reference voltage Vref2 in order to convert a voltage into a time. The coded data items TA1, TA2, and TA3 representing obtained times T1, T2, and T3 respectively, and the A/D-converted values Lf1 and Lf2 predefined for the reference voltages Vref1 and Vref2 are used to perform normalization. Eventually, the A/D-converted value AD(m-1:0) of the input voltage Vin is calculated.

The A/D converter 1 converts the input voltage Vin1 and reference voltages Vref1 and Vref2 into times using the same ramp-wave voltage V1 at every time of A/D conversion. When the high-precision reference voltages Vref and Vref are employed, a high-precision A/D-converted value can be calculated despite a change in a constant specific to an element caused by a change in temperature or a variation of a constant specific to an element occurring during a manufacturing process.

Moreover, the reference voltages Vref1 and Vref2 are determined to be the lower and upper limits of the range of voltages assumed by the input voltage Vin1 to be transferred to the voltage-to-time conversion circuit 5. When the formula (12) representing the relationship of the A/D-converted value Y to the coded data X is defined, or when the A/D-converted value Y of the input voltage Vin is calculated according to the formula (15), occurrence of an arithmetical error can be minimized.

The margin voltage is generated as a voltage, by which the reference voltage Vref1 is separated from the input voltage Vin1 and the input voltage Vin1 is separated from the reference voltage Vref2, in order to ensure the reset time Tα. The voltage-to-time conversion circuit 5 can reliably produce a PB pulse whose timing indicates the timing that each voltage has a predetermined relationship to the ramp-wave voltage. The voltage Vin1 produced by narrowing the range of voltages assumed by the extraneous input voltage Vin is transferred to the voltage-to-time conversion circuit 5. Although the margin voltage is generated, the supply voltage of the voltage-to-time conversion circuit 5 need not be extended. Moreover, since the range of voltages is narrowed, the input voltage of the comparator 18 will not be close to 0 V or the voltage VDD. The comparator 18 can be used within the range of voltages assumed by the input voltage within which the comparator requires a small offset voltage.

When A/D conversion is initiated with the signal PA driven high, the ramp-wave voltage V1 is initialized to a voltage lower than the reference voltage Vref1. Unlike a conventional double integral type A/D converter, the ramp-wave voltage need not be fully initialized to an initial voltage (0 V). Moreover, in the ramp-wave generation circuit 4, the capacitor C1 is discharged by the transistor Q4 connected in parallel with the capacitor C1. Therefore, precision in conversion will not be degraded but the time required for initialization of the ramp-wave voltage V1 and the A/D conversion time can be shortened.

Furthermore, the conventional double integral type A/D converter requires an operational amplifier as a component of an integrator. The A/D converter 1 includes the ramp-wave generation circuit 4 on behalf of the integrator. Consequently, the scale of the circuitry of the A/D converter 1 is smaller than that of the conventional one.

Second Embodiment

Next, the second embodiment of the present invention will be described with reference to FIG. 11 to FIG. 13.

Figure 11:
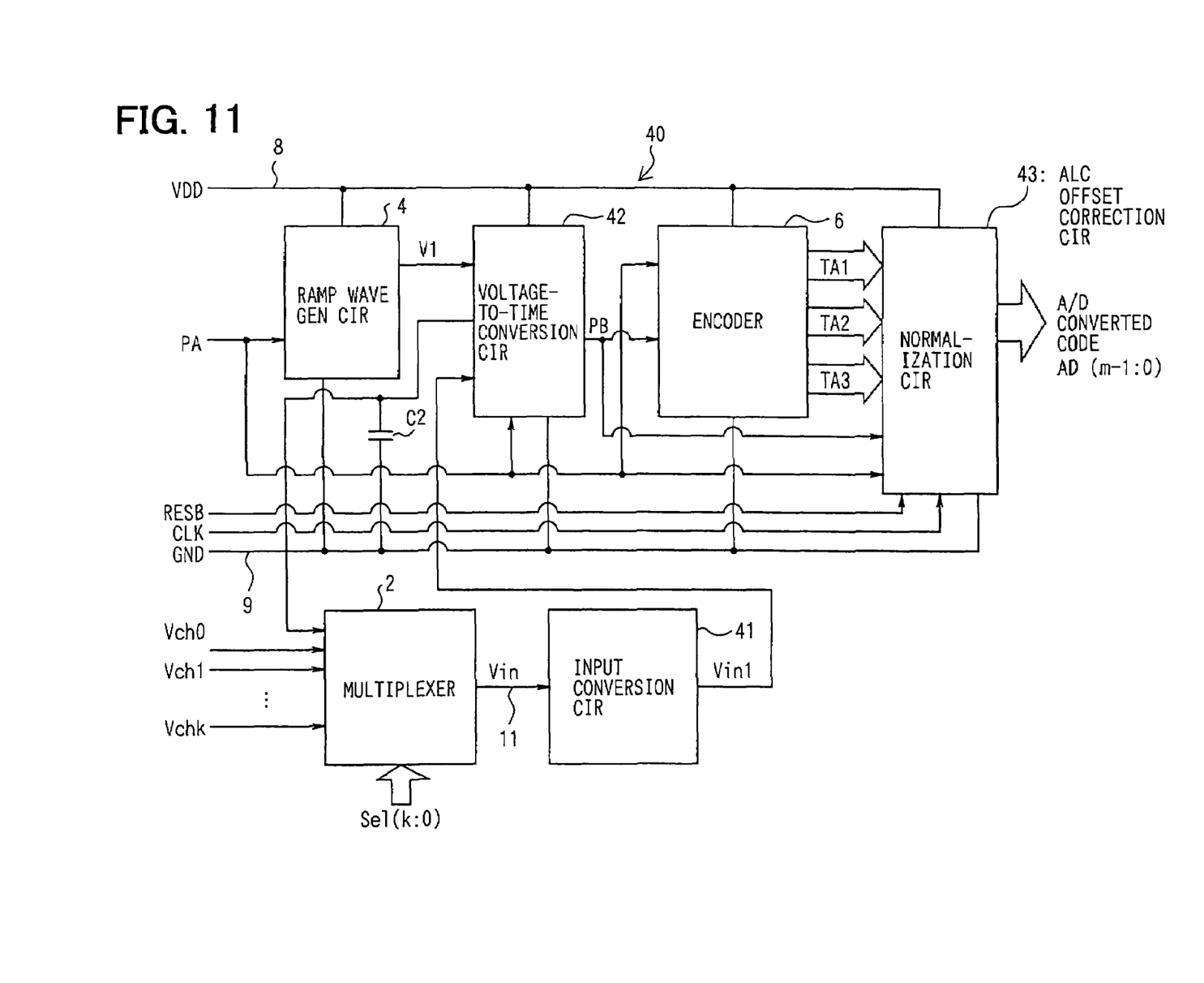
FIG. 11 is a block diagram showing the overall configuration of an A/D converter in accordance with a second embodiment and is equivalent to FIG. 1.

FIG. 11 is a block diagram showing the overall configuration of an A/D converter. The same reference numerals as those in FIG. 1 are assigned to components identical to those in FIG. 1. An A/D converter 40 is different from the A/D converter 1 shown in FIG. 1 in a point that the A/D converter 40 further comprises an input buffer, a sample-and-hold circuit, and an offset correction circuit. Accordingly, the input conversion circuit 41, voltage-to-time conversion circuit 42, and normalization circuit 43 are modified. The offset correction circuit is included in order to eliminate an adverse effect of an offset voltage or the like caused or required by, for example, the input buffer or sample-and-hold circuit.

Figure 12:
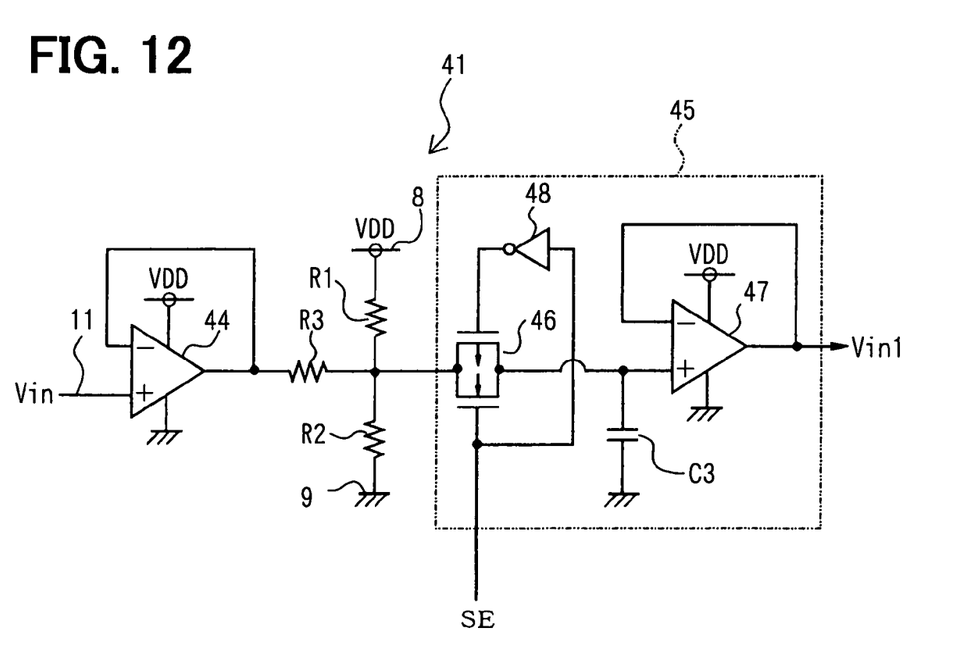
FIG. 12 is equivalent to FIG. 3.

FIG. 12 shows the circuitry of the input conversion circuit 41. A voltage conversion unit composed of resistors R1 to R3 and a resistance offered by the voltage conversion unit are identical to those of the input conversion circuit 3 shown in FIG. 3. The input conversion circuit 41 has the input buffer 44 connected between an input line 11 and the resistor R3. The sample-and-hold circuit 45 is connected in a stage succeeding the voltage conversion unit. The sample-and-hold circuit 45 comprises an analog switch 46, a holding capacitor C3, and a buffer 47. The input buffer 44 and buffer 47 are realized with operational amplifiers that act as voltage followers. The analog switch 46 is controlled to be turned on or off according to a control signal SE and a control signal that is a reverse of the control signal SE produced by an inverter 48.

Figure 13:
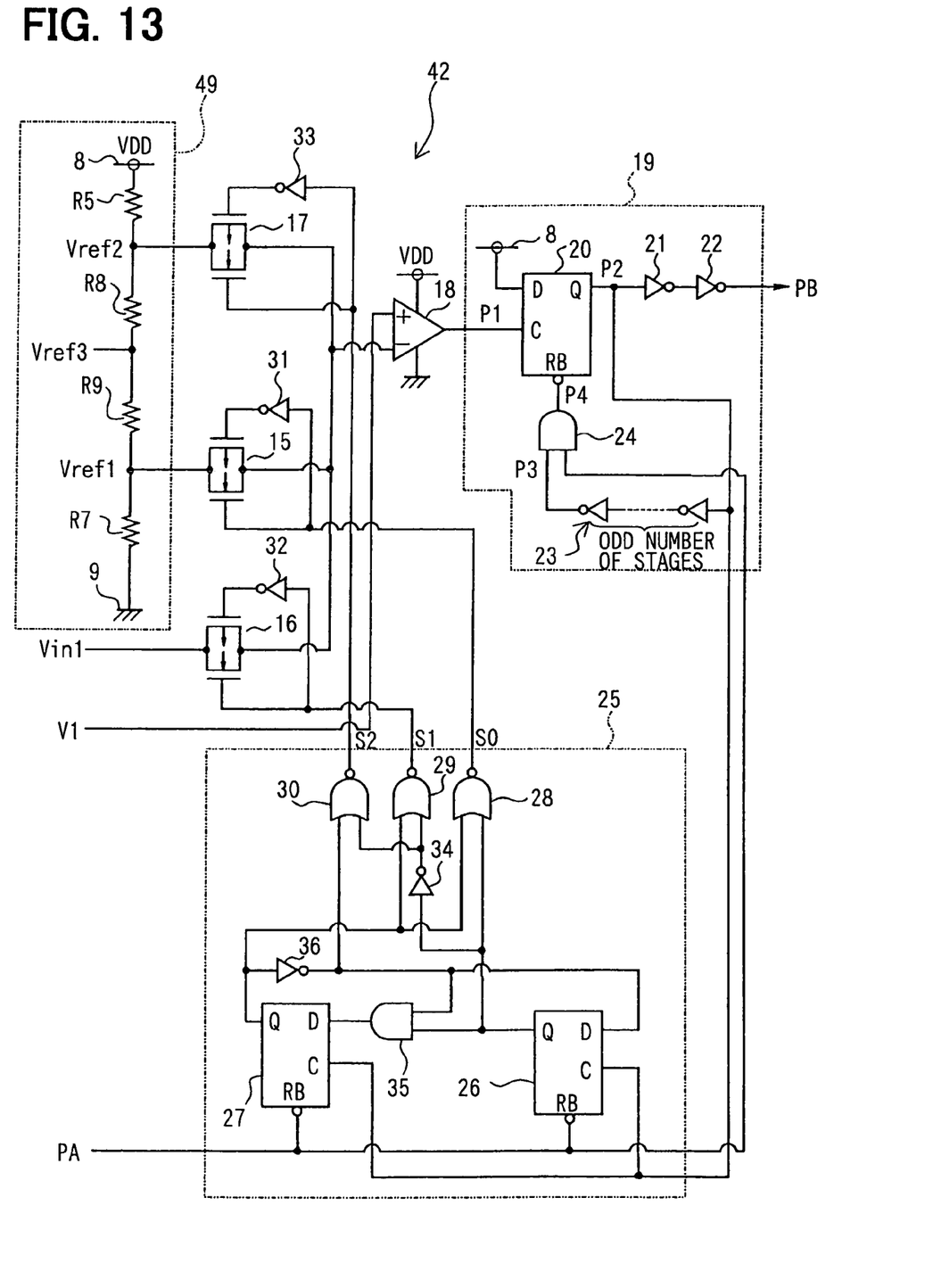
FIG. 13 is equivalent to FIG. 5.

FIG. 13 shows the circuitry of the voltage-to-time conversion circuit 42. A reference voltage generation circuit 49 (equivalent to a correction reference voltage generation circuit) incorporated in the voltage-to-time conversion circuit 42 has resistors R5, R8, R9, and R7 connected in series with one another between power lines 8 and 9. Reference voltages Vref2, Vref3, and Vref1 (equivalent to the second reference voltage, correction reference voltage, and first reference voltage) are developed at the node between the resistors R5 and R8, the node between the resistors R8 and R9, and the node between the resistors R9 and R7. A capacitor C2 is connected between the node between the resistors R8 and R9 and the power line 9 (see FIG. 11). The other circuits are identical to those in the voltage-to-time conversion circuit 5 shown in FIG. 5.

A normalization circuit 43 (equivalent to an arithmetic and logic circuit and an offset correction circuit) shown in FIG. 11 has, in addition to an ability to calculate an A/D-converted value in the same manner as the normalization circuit 7 described in relation to the first embodiment, an ability to use an offset correction value to correct an A/D-converted value of an input voltage on the basis of an A/D-converted value produced by A/D-converting a correction reference voltage Vref3 regarded as an input voltage and an A/D-converted value predefined for the correction reference voltage Vref3.

The fundamentals of the A/D converter 40 are identical to those of the A/D converter 1. Differences alone will be described below. Before A/D conversion is initialized with a signal PA driven high, a control signal SE is changed from the high level (sampling) to a low level (holding). Thus, a sampled input voltage Vin1 is held. Since the sample-and-hold circuit 45 is included, an error in A/D conversion caused by a variation of an input voltage Vin occurring during A/D conversion can be prevented. Moreover, since the input buffer 44 is included, even a voltage sent from a sensor whose output impedance is relatively high can be converted highly precisely.

When the correction reference voltage Vref3 produced by the reference voltage generation circuit 49 is received via a multiplexer 2, the normalization circuit 43 stores in a memory a difference (offset) of the A/D-converted value of the correction reference voltage Vref3 from an A/D-converted value predefined for the correction reference voltage Vref3. Thereafter, the offset is used to correct an A/D-converted value AD(m-1:0) of an input voltage Vin. A conceivable cause of the offset is an offset voltage required by the input buffer 44 or buffer 47.

For example, when the A/D converter 40 offers a resolution of 10 bits, the correction reference voltage Vref3 is set to a value corresponding to a product of a voltage VDD by 2 (=2.5 V). When the A/D-converted value of the correction reference voltage Vref3 is 513, the difference (=1) from an estimated A/D-converted value of 512 is regarded as an offset. The normalization circuit 43 subtracts the offset of 1 from the A/D-converted value AD(m-1:0) calculated based on coded data TA1, TA2, or TA3 so as to produce a final A/D-converted value. The calculation of the offset using the correction reference voltage Vref3 is performed every time the power supply is turned on, at intervals of a predetermined time, or at every time of A/D conversion.

The present embodiment has an advantage owing to the inclusion of the input buffer 44 and sample-and-hold circuit 45. In addition, since an adverse effect of an offset voltage required by an added circuit can be eliminated, the A/D converter 40 offers higher precision than the A/D converter 1 in accordance with the first embodiment.

(Other Embodiment)

The present invention is not limited to the foregoing embodiments shown in the drawings. The embodiments can be modified or extended as described below.

The ramp-wave voltage V1 may be a voltage that steps down at a certain gradient. In this case, the ramp-wave voltage V1 need not be fully initialized to the same voltage as a supply voltage VDD but may be initialized to a voltage higher at least than a reference voltage Vref2. Thus, the next A/D conversion can be initiated.

The voltage-to-time conversion circuit 5 or 42 includes the analog switches 15, 16, and 17 and the selection control circuit 25 for the purpose of decreasing the number of comparators, and sequentially selects a voltage to be applied to the comparator 18. Alternatively, dedicated comparators may be included in association with the reference voltage Vref1, input voltage Vin1, and reference voltage Vref2 respectively. Moreover, times into which the reference voltage Vref1, input voltage Vin1, and reference voltage Vref2 are converted are transmitted in the form of a common PB pulsating signal. Alternatively, the times may be transmitted as independent signals.

Although the reference voltages Vref1 and Vref2 are close or equal to the input voltage Vin1, the voltage-to-time conversion circuit may be able to produce times (for example, PB pulses) required by the reference voltages Vref1 and Vref2 and the input voltage Vin1 respectively. In this case, the aforesaid margin voltage need not be generated. Moreover, the reference voltages Vref1 and Vref2 need not be set to the lower and upper limits of the range of voltages assumed by the input voltage Vin1, but can be determined to fall within the range of voltages assumed by the input voltage Vin1.

Moreover, three or more reference voltages may be predefined. Coded data representing the time required by the input voltage Vin1 may be fitted to a conversion characteristic curve determined using coded data items, which represent times required by the reference voltages, and A/D-converted values predefined for the reference voltages, whereby the A/D-converted value of the input voltage Vin1 may be calculated. In this case, when a circuit includes a circuit element exhibiting a nonlinear characteristic, an A/D-converted value can be calculated with higher precision than it is calculated using two reference voltages.

According to the first embodiment, even when the input voltage Vin may be transferred to the voltage-to-time conversion circuit 5 via the multiplexer 2 as it is, if the voltage-to-time conversion circuit 5 can produce PB pulses whose timings indicate the timings that the input voltage Vin and reference voltages Vref1 and Vref2 have a predetermined relationship with the ramp-wave voltage, the input conversion circuit 3 may be excluded. Moreover, in this case, according to the second embodiment, the voltage conversion unit composed of the resistors R1 to R3 may be excluded.

According to the second embodiment, one of the input buffer 44 and sample-and-hold circuit 45 may be excluded.

What is claimed is:

1. An A/D converter comprising:
    a ramp-wave generation circuit that generates a ramp-wave voltage which steps up or down at a certain gradient;
    a reference voltage generation circuit that produces a first reference voltage and a second reference voltage;
    a voltage-to-time conversion circuit that compares the ramp-wave voltage with each of the first reference voltage, second reference voltage, and an input voltage that is an object of conversion, and produces times which the first reference voltage, second reference voltage, and input voltage require for having a predetermined relationship to the ramp-wave voltage;
    an encoder circuit that converts the three times produced by the voltage-to-time conversion circuit into coded data items proportional to the times; and
    an arithmetic and logic circuit that fits the coded data, into which the time required by the input voltage is converted by the encoder circuit, to a conversion characteristic curve determined based on the coded data items, into which the times required by the first and second reference voltages are converted by the encoder circuit, and A/D-converted values predefined for the first and second reference voltages, and thus calculates the A/D-converted value of the input voltage.

2. The A/D converter according to claim 1, wherein the first reference voltage is set to a voltage lower than the range of voltages assumed by the input voltage of the voltage-to-time conversion circuit, and the second reference voltage is set to a voltage higher than the range of voltages assumed by the input voltage of the voltage-to-time conversion circuit.

3. The A/D converter according to claim 2, wherein the first reference voltage is set to a voltage lower by a predetermined margin voltage than the range of voltages assumed by the input voltage of the voltage-to-time conversion circuit, and the second reference voltage is set to a voltage higher by the predetermined margin voltage than the range of voltages assumed by the input voltage of the voltage-to-time conversion circuit.

4. The A/D converter according to claim 2, wherein an input conversion circuit for converting the input voltage of the voltage-to-time conversion circuit so that the range of voltages assumed by the input voltage will be narrower than the range of voltages assumed by an extraneous input voltage is included as a stage preceding the voltage-to-time conversion circuit.

5. The A/D converter according to claim 4, wherein the input conversion circuit includes an input buffer and a sample-and-hold circuit.

6. The A/D converter according to claim 1, further comprising:
    a correction reference voltage generation circuit that produces a correction reference voltage; and
    an offset correction circuit that uses an offset to correct an A/D-converted value sent from the arithmetic and logic circuit according to an A/D-converted value produced by A/D-converting the correction reference voltage regarded as an input voltage, and an A/D-converted value estimated for the correction reference voltage.

7. An A/D converter comprising:
a ramp-wave generation circuit that generates a ramp-wave voltage which steps up or down at a certain gradient;
a reference voltage generation circuit that produces a plurality of reference voltages;
a voltage-to-time conversion circuit that compares the ramp-wave voltage with each of the plurality of reference voltages and an input voltage which is an object of conversion, and produces times which the reference voltages and input voltage require for having a predetermined relationship to the ramp-wave voltage;
an encoder circuit that converts the times produced by the voltage-to-time conversion circuit into coded data items proportional to the times; and
an arithmetic and logic circuit that fits the coded data, into which the time required by the input voltage is converted by the encoder circuit, to a conversion characteristic curve determined based on the coded data items, into which the times required by the reference voltages are converted by the encoder circuit, and A/D-converted values predefined for the reference voltages, and thus calculates the A/D-converted value of the input voltage.

8. The A/D converter according to claim 6, further comprising:
a correction reference voltage generation circuit that produces a correction reference voltage; and
an offset correction circuit that uses an offset to correct an A/D-converted value sent from the arithmetic and logic circuit according to an A/D-converted value produced by A/D-converting the correction reference voltage regarded as an input voltage, and an A/D-converted value estimated for the correction reference voltage.

* * * * *